United States Patent
Rozenblit et al.

(10) Patent No.: US 8,331,881 B2
(45) Date of Patent: Dec. 11, 2012

(54) DIFFERENTIAL TO SINGLE-ENDED CONVERTER

(75) Inventors: Dmitriy Rozenblit, Irvine, CA (US); Ahmad Mirzaei, Costa Mesa, CA (US)

(73) Assignee: Broadcom Corporation, Irvine, CA (US)

( * ) Notice: Subject to any disclaimer, the term of this patent is extended or adjusted under 35 U.S.C. 154(b) by 285 days.

(21) Appl. No.: 12/696,845

(22) Filed: Jan. 29, 2010

(65) Prior Publication Data

US 2011/0189965 A1 Aug. 4, 2011

(51) Int. Cl.
*H01Q 11/12* (2006.01)
(52) U.S. Cl. .......................... 455/118; 455/323; 332/103
(58) Field of Classification Search .................. 455/118, 455/323, 326, 333, 93, 241.1, 242.2; 327/231, 327/238, 246, 334, 335, 336, 355, 52, 65, 327/89, 100; 375/283, 244, 318; 331/167, 331/177 R
See application file for complete search history.

(56) References Cited

U.S. PATENT DOCUMENTS

| | | | |
|---|---|---|---|
| 6,606,489 B2 * | 8/2003 | Razavi et al. | 455/323 |
| 7,463,108 B2 * | 12/2008 | Horng et al. | 332/103 |
| 7,583,156 B2 * | 9/2009 | Hung et al. | 331/167 |
| 2010/0285757 A1 * | 11/2010 | Rofougaran et al. | 455/77 |

* cited by examiner

*Primary Examiner* — Nay A Maung
*Assistant Examiner* — Chung-Tien Yang
(74) *Attorney, Agent, or Firm* — Sterne, Kessler, Goldstein & Fox P.L.L.C.

(57) ABSTRACT

Embodiments enable a multi-band transmitter with significantly reduced architecture area by allowing maximum reuse of transmitter stages across supported frequency bands and signal standards. Further, embodiments allow a monolithic transmitter implementation by providing an integration-friendly differential to single-ended conversion stage. According to embodiments, the differential to single-ended conversion stage is readily configurable according to the frequency band and signal standard of operation of the transmitter.

22 Claims, 4 Drawing Sheets

DIFFERENTIAL TO SINGLE-ENDED CONVERTER

BACKGROUND

1. Field of the Invention

The present invention relates generally to converter circuits.

2. Background Art

In multi-band transmitters, baseband to radio frequency (RF) stages of the transmitter are designed as differential circuits for several reasons, including reducing common mode noise, cascading the gain stage without multiple bias elements, and allowing higher output signal swing. As a result, differential to single-ended signal conversion is required at the output stage.

Conventionally, differential to single-ended signal conversion at the output stage is performed using transformers. However, because each of the transformers needs to be optimized according to a respective frequency band, the reuse of transformers across frequency bands is precluded and a separate transformer is required for each band supported by the transmitter. The transmitter area thus tends to be very large. Further, because transformers are generally not integration-friendly, the implementation of the transmitter as a monolithic chip is significantly complicated.

There is a need therefore for improved differential to single-ended converters which are small in area and integration-friendly.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

The present invention will be described with reference to the accompanying drawings. Generally, the drawing in which an element first appears is typically indicated by the leftmost digit(s) in the corresponding reference number.

DETAILED DESCRIPTION OF EMBODIMENTS

Figure 1:
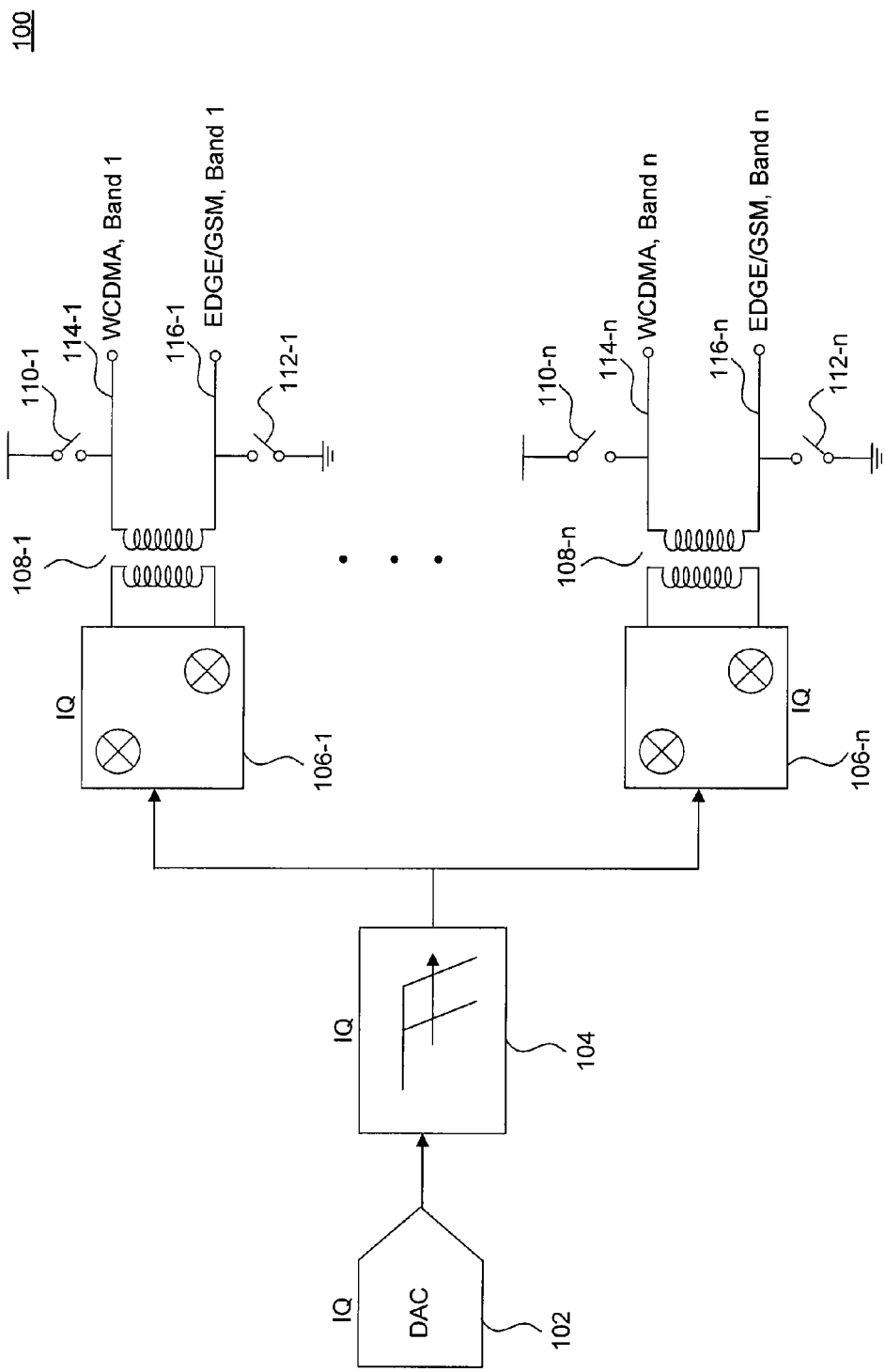
FIG. 1 illustrates an example multi-band transmitter.

FIG. 1 illustrates an example multi-band multi-mode transmitter 100. As shown in FIG. 1, example transmitter 100 includes a digital-to-analog converter (DAC) 102, a filter 104, and a plurality of parallel output paths each corresponding to a respective frequency band of the multi-band transmitter. Each output path includes an IQ mixer 106, a transformer 108, and multiple output terminals 114 and 116. At any given time, at most one of the frequency bands (Band 1 through Band n) supported by the transmitter is used. Thus, at most one of the parallel output paths of the transmitter is active at any given time.

Output terminals 114 and 116 each corresponds to one or more respective signal standards (i.e., modes) that operate in a similar frequency range. For example, as shown in FIG. 1, output terminal 114 is used for the WCDMA mode, whereas output terminal 116 is used for the EDGE or GSM modes. At any given time, at most one of output terminals 114 and 116 is active.

Output terminals 114-$\{1, \ldots, n\}$ and 116-$\{1, \ldots, n\}$ are selectively coupled to subsequent respective stages of the transmitter (e.g., power amplifier (PA) stages, antennas, etc.) depending on the frequency band and signal standard of operation. In example transmitter 100, this is performed using switches 110-$\{1, \ldots, n\}$ and 112-$\{1, \ldots, n\}$, which are coupled respectively between output terminals 114-$\{1, \ldots, n\}$ and 116-$\{1, \ldots, n\}$ and an AC ground (not shown in FIG. 1). For example, when transmitter 100 is operated to generate a WCDMA signal in frequency Band 1, all but switch 110-1 are turned on (i.e., closed) to couple all output terminals to the AC ground, except for output terminal 114-1 which is coupled to a subsequent stage of the transmitter.

Typically, to reduce common mode noise, baseband to RF stages (e.g., DAC 102, filter 104, and IQ mixers 106-$\{1, \ldots, n\}$) are designed as differential circuits that generate differential outputs. However, because subsequent stages of the transmitter (e.g., PAs, antennas, etc.) receive single-ended inputs, differential to single-ended signal conversion of the mixer outputs is required. In example transmitter 100, this is achieved using transformers 108-$\{1, \ldots, n\}$ and switches 110-$\{1, \ldots, n\}$ and 112-$\{1, \ldots, n\}$, operated as described above to form a differential to single-ended conversion stage. In particular, when active, transformer 108 receives a differential input from mixer 106 and generates a single-ended output in the active one of output terminals 114 and 116.

Generally, however, each of transformers 108-$\{1, \ldots, n\}$ needs to be optimized according to its respective frequency band. As a result, the reuse of transformers 108-$\{1, \ldots, n\}$ across frequency bands is ruled out in example transmitter 100, and a separate transformer is required for each band supported by the transmitter. The sharing of mixers 106 across frequency bands is also complicated by the inability to reuse transformers 108. Thus, example transmitter 100 suffers from an area perspective, where as many mixers/transformers are required as frequency bands supported by the transmitter. Further, because transformers 108 are generally not integration-friendly (mainly due to size considerations; each transformer is approximately 300 μm×300 μm in area), the implementation of example transmitter 100 as a monolithic chip is significantly complicated.

Embodiments of the present invention, as further described below, cure the deficiencies of example transmitter 100. In particular, embodiments enable a multi-band transmitter with significantly reduced architecture area by allowing maximum reuse of transmitter stages across supported frequency bands and signal standards. Further, embodiments allow a monolithic transmitter implementation by providing an integration-friendly differential to single-ended conversion stage. According to embodiments, the differential to single-ended conversion stage is readily configurable according to the frequency band and signal standard of operation of the transmitter.

It is important to note, however, that embodiments may be used outside the context of a multi-band transmitter to support any kind of differential to single-ended signal conversion with maximum reuse across frequency. Thus, while embodiments may be described within the context of a multi-band transmitter below, these embodiments are provided within this context for the purpose of illustration only and are not limited to such context as would be understood by a person skilled in the art based on the teachings herein.

Figure 2:
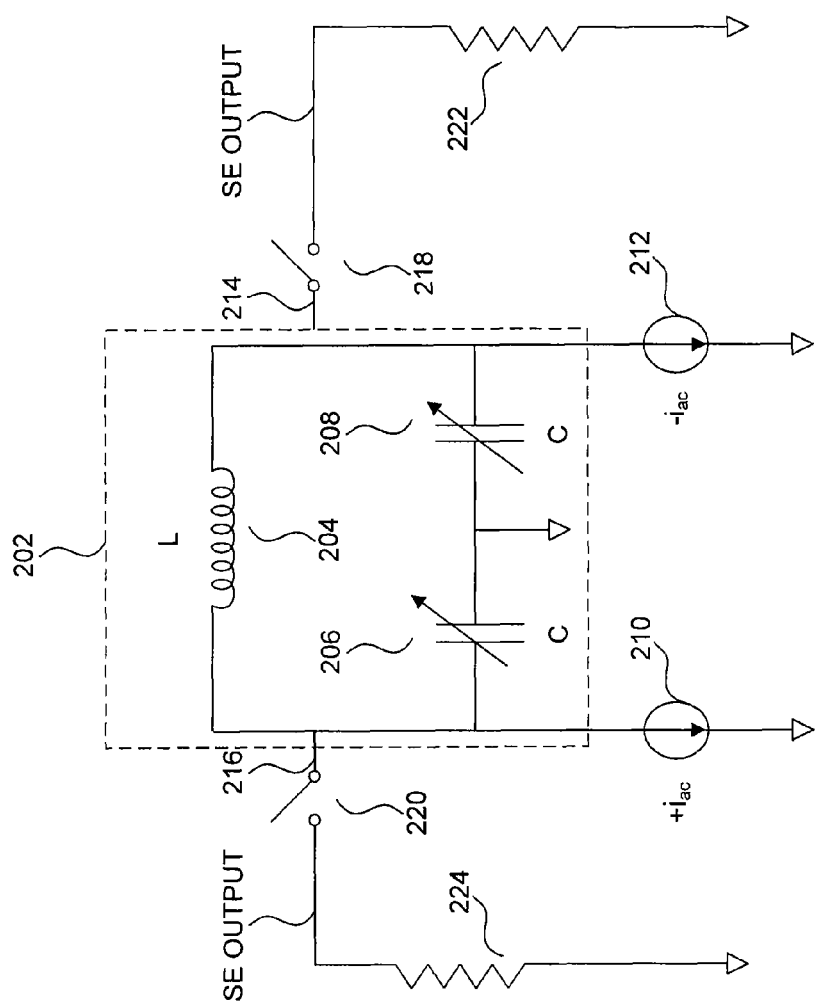
FIG. 2 illustrates an example differential to single-ended converter according to an embodiment of the present invention.

FIG. 2 illustrates an example differential to single-ended converter 200 according to an embodiment of the present invention. As shown in FIG. 2, converter 200 includes an LC circuit 202 with first and second output terminals 214 and 216.

LC circuit 202 includes an inductor L 204 coupled in parallel with first and second capacitors C 206 and C 208. In an embodiment, capacitors 206 and 208 are tunable. LC circuit 202 receives differential input signals from a differential output circuit. For example, as shown in FIG. 2, LC circuit 202 receives differential current signals $+i_{ac}$ 210 and $-i_{ac}$ 212 and generates a single-ended output signal in one of output terminals 214 and 216. In the context of a transmitter application, differential current signals $+i_{ac}$ 210 and $-i_{ac}$ 212 may represent differential AC currents at RF frequency generated by a RF mixer.

Output terminals 214 and 216 are selectively coupled using switches 218 and 220 respectively to respective loads 222 and 224. At any given time, at most one of output terminals 214 and 216 is coupled to its respective load, while the other output terminal is unused.

In the context of a multi-mode transmitter application, output terminals 214 and 216 each corresponds to one or more respective signal standards (i.e., modes) that operate in a similar frequency range. For example, output terminal 214 may be used for the WCDMA mode, whereas output terminal 216 may be used for the EDGE or GSM modes. Further, loads 222 and 224 may represent antennas attached to the output of the transmitter. Alternatively or additionally, loads 222 and 224 may represent the input resistances of subsequent stages coupled to converter 200.

Differential to single-ended conversion of differential signals $+i_{ac}$ 210 and $-i_{ac}$ 212 occurs when the resonant frequency of LC circuit 202 matches the frequency of signals $+i_{ac}$ 210 and $-i_{ac}$ 212 (i.e., resonance condition). In operation, LC circuit 202 may be tuned by adjusting capacitors C 206 and C 208 in order to satisfy the resonance condition. When that occurs, the difference of signals $+i_{ac}$ 210 and $-i_{ac}$ 212 is generated in one of loads 222 and 224, depending on which of outputs 214 and 216 is being used. In other words, differential signals $+i_{ac}$ 210 and $-i_{ac}$ 212 add up in the active load.

Figure 3:
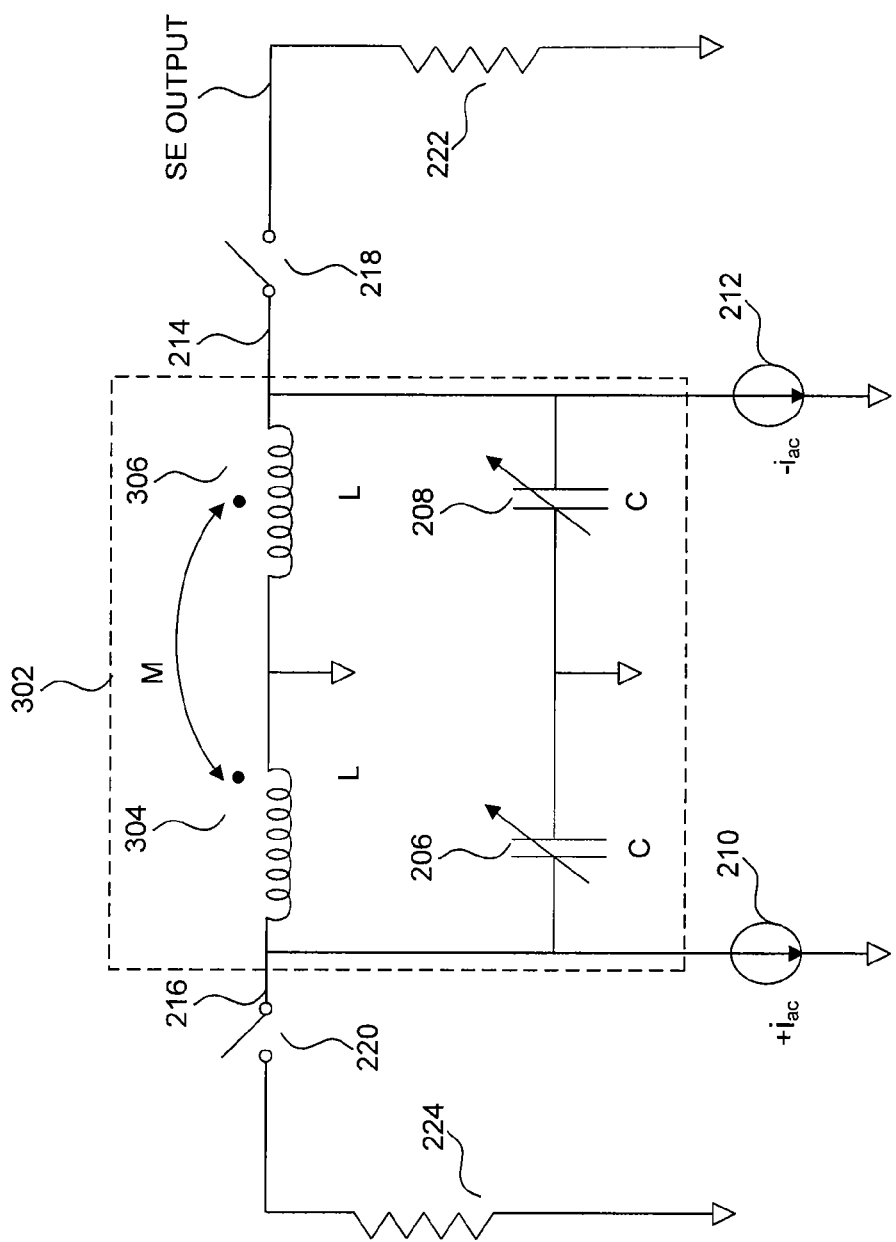
FIG. 3 illustrates an example differential to single-ended converter according to an embodiment of the present invention.

FIG. 3 illustrates another example differential to single-ended converter 300 according to an embodiment of the present invention. As shown in FIG. 3, example converter 300 includes an LC circuit 302 with first and second output terminals 214 and 216. LC circuit 302 includes a differential inductor, comprised of inductors L 304 and L 306, coupled in parallel with first and second capacitors C 206 and C 208. Inductors 304 and 306 have a mutual coupling, M, also called a mutual inductance.

In other aspects, example converter 300 is substantially similar to example converter 200 described above with reference to FIG. 2. In particular, example converter 300 operates to convert a differential input signal into a single-ended output signal when the resonant frequency of LC circuit 302 matches the frequency of the input signal (i.e., resonance condition).

With reference to FIG. 3, the resonance condition of example converter 300 can be expressed mathematically as:

$$X_M^2 - (X_L + X_C)X_M + X_L X_C = 0 \qquad (1)$$

with $X_M = M\omega_{RF}$ (the mutual impedance of inductors L 304 and L 306), $$X_L = L\omega_{RF}, \text{ and } X_C = \frac{1}{C\omega_{RF}}.$$

Alternatively, the resonance condition can be re-written in terms of the coupling factor $$k = \frac{M}{L}$$

as follows:

$$k^2 - \left(1 + \frac{1}{LC\omega_{RF}^2}\right)k + \frac{1}{LC\omega_{RF}^2} = 0. \qquad (2)$$

Generally, example converter 300 is suitable for applications in which the differential output circuit coupled to the converter requires a DC signal for operation (e.g., RF mixers generally require DC currents for operation). Accordingly, the center tap point of the differential inductor (i.e., the coupling point of inductors L 304 and L 306) can be connected to a Vdd supply voltage, for example, to supply DC current to the differential output circuit.

As can be noted from FIGS. 2 and 3, example converters 200 and 300 use no transformers. As a result, a main obstacle to integrating the converter into a chip (e.g., transmitter chip) is eliminated according to embodiments of the present invention. Further, converters 200 and 300 have approximately equal gain as an ideal transformer. Thus, the coupling loss of typical transformers is also eliminated according to embodiments of the present invention.

It is also noted that, in the context of a multi-band multi-mode transmitter, a structure such as LC circuit 202 or 302 is sufficient to support at least one frequency band of the transmitter as signals tend to be narrowband in nature. Further, the same structure can be used for all modes operating in the same frequency band. However, as will be further described below, reuse across frequency bands of a single structure is also possible, making for a compact multi-band multi-mode differential to single-ended converter.

Figure 4:
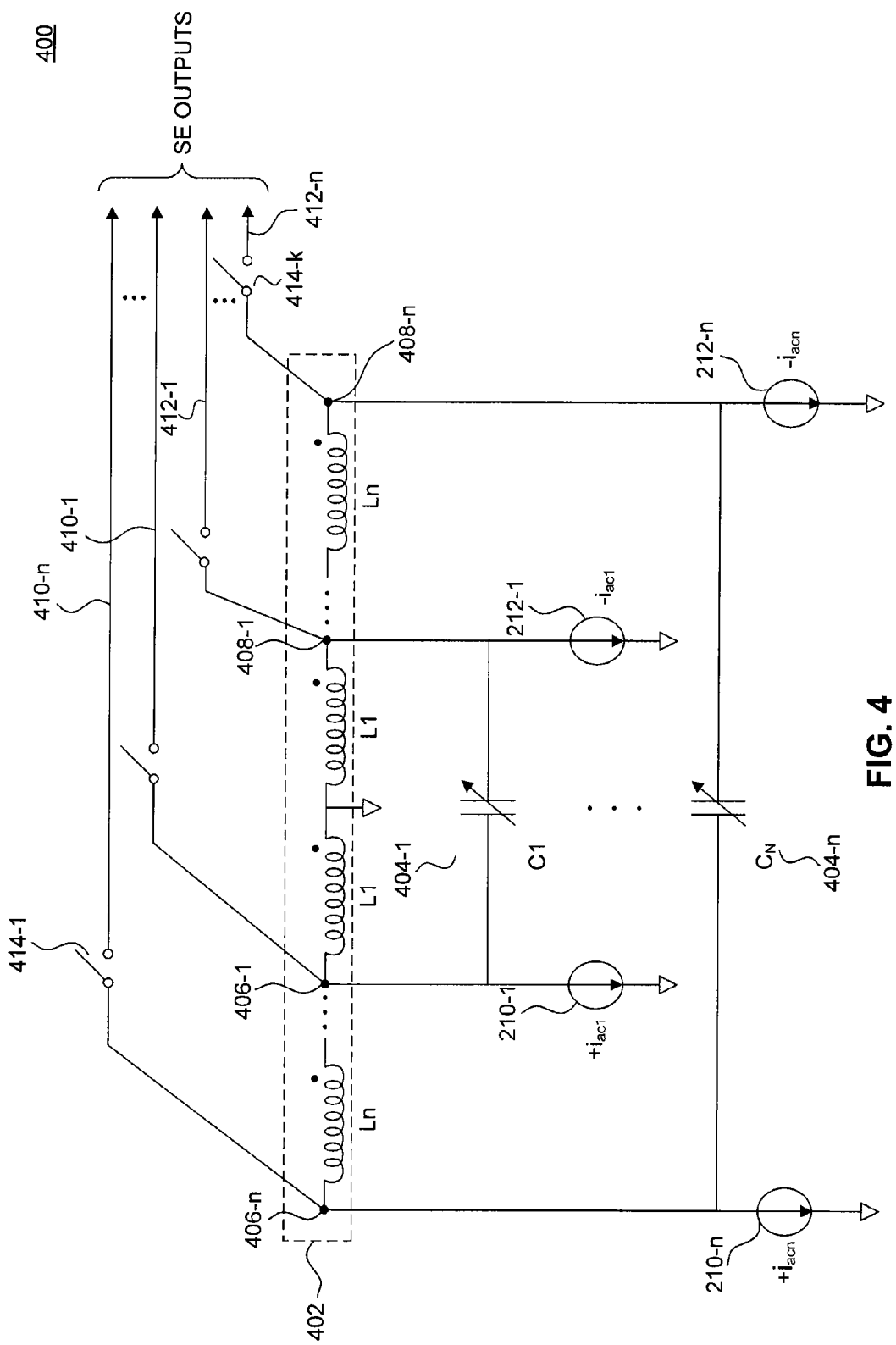
FIG. 4 illustrates an example differential to single-ended converter according to an embodiment of the present invention.

FIG. 4 illustrates an example differential to single-ended converter 400 according to an embodiment of the present invention. Example converter 400 supports differential to single-ended signal conversion across a plurality of frequency bands. As such, example converter 400 is suitable for use in a multi-band transmitter, for example.

As shown in FIG. 4, example converter 400 includes a multi-tap inductor 402 and a plurality of capacitors 404-$\{1, \ldots, n\}$. Each of capacitors 404-$\{1, \ldots, n\}$ is coupled to a respective portion of multi-tap inductor 402 at respective corresponding tap points 406 and 408 of multi-tap inductor 402. For example, as shown in FIG. 4, capacitor 404-1 is coupled to a first portion of multi-tap inductor 402 at corresponding tap points 406-1 and 408-1. Similarly, capacitor 404-$n$ is coupled to a second portion of the multi-tap inductor 402 at corresponding tap points 406-$n$ and 408-$n$.

In an embodiment, as shown in FIG. 4, multi-tap inductor 402 is a differential inductor having a center tap point coupled to AC ground. Further, each of capacitors 404-$\{1, \ldots, n\}$ is coupled to a respective portion of the inductor that is centered at the center tap point and that includes two inductances of equal value, symmetrically located around the center tap point.

In an embodiment, each of capacitors 404-$\{1, \ldots, n\}$ and its respective portion of inductor 402 are designed for a respective frequency band supported by the converter. For example, capacitor 404-1 and the first portion of inductor 402 (between tap points 406-1 and 408-1) may be designed for a first frequency band and may thus be configured to have a resonant frequency in the first frequency band. Similarly, capacitor 404-$n$ and the second portion of inductor 402 (between tap points 406-$n$ and 408-$n$) may be designed for a second frequency band and may thus be configured to have a resonant frequency in the second frequency band. Further, capacitors 404-1 and 404-$n$ may be adjusted to tune the first and second resonant frequencies, respectively, within the respective bands. It is noted that the resonant frequency in Hertz of an LC circuit is provided by $$f = \frac{1}{2\pi\sqrt{LC}}.$$

Depending on the selected frequency band of operation, example converter 400 receives first and second differential input signals 210 and 212 at respective tap points 406 and 408. For example, when converter 400 is operated in the first frequency band, converter 400 receives differential input signals 210-1 and 210-2 at tap points 406-1 and 408-1, respectively. Similarly, when converter 400 is operated in the second frequency band, converter 400 receives differential input signals 210-$n$ and 210-$n$ at tap points 406-$n$ and 408-$n$, respectively. In the context of a transmitter application, differential input signals 210 and 212 may represent AC differential current signals generated by a mixer circuit, for example.

Converter 400 generates a single-ended output signal at one of its output terminals 410-$\{1, \ldots, n\}$ and 412-$\{1, \ldots, n\}$ based on the received first and second differential input signals 210 and 212. In an embodiment, the single-ended output signal is a difference of the received first and second differential input signals 210 and 212.

In an embodiment, the single-ended output signal is generated by selectively coupling tap points 406 and 408 to respective ones of output terminals 410 and 412 of converter 400 via respective switches 414. At any given time, at most one of switches 414-$\{1, \ldots, k\}$ is turned on to couple at most one of tap points 406-$\{1, \ldots, n\}$ and 408-$\{1, \ldots, n\}$ to a respective one of output terminals 410-$\{1, \ldots, n\}$ and 412-$\{1, \ldots, n\}$ of the converter, assuming a single band in operation. In particular, at most one of switches 414-$\{1, \ldots, k\}$ is turned on at any given time based on a desired frequency band and a desired signal standard of the output signal. In an embodiment, the desired signal standard is one of WCDMA, EDGE, GSM, HSPA, CDMA2000, WLAN, LTE, and WMAX.

As noted above, example converter 400 is suitable for use in a multi-band transmitter. Further, because of the reuse of inductor 402 across frequency bands and the elimination of transformers, converter 400 is small in area that it can be readily integrated within a transmitter chip, for example.

In an embodiment, converter 400 is integrated in a multi-band transmitter. The multi-band transmitter may have a first and a second differential output mixer circuits, corresponding respectively to a first and a second frequency bands of the multi-band transmitter. When the multi-band transmitter is operated in the first frequency band, first and second differential signals generated by the first mixer circuit are coupled respectively to tap points 406-1 and 408-1 of the multi-tap inductor. Based on the selected mode of operation, a single-ended output based on the first and second differential signals is generated in one of output terminals 410-1 and 412-1 of converter 400. Similarly, when the multi-band transmitter is operated in the second frequency band, the second mixer circuit generates third and fourth differential signals, which are coupled respectively to tap points 406-$n$ and 408-$n$ of the multi-tap inductor. Based on the selected mode of operation, a single-ended output based on the third and fourth differential signals is generated in one of output terminals 410-$n$ and 412-$n$ of converter 400.

Embodiments have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of embodiments of the present invention should not be limited by any of the above-described exemplary embodiments, but should be defined only in accordance with the following claims and their equivalents.

What is claimed is:

1. A differential to single-ended converter, comprising:
a multi-tap inductor;
a first capacitor coupled to a first portion of the multi-tap inductor at first and second tap points of the multi-tap inductor;
a second capacitor coupled to a second portion of the multi-tap inductor at third and fourth tap points of the multi-tap inductor; and
at least one switch configured to selectively couple one of the first, second, third, and fourth tap points to a respective output terminal of the converter to generate a single-ended output signal of the converter.

2. The converter of claim 1, wherein the first capacitor and the first portion of the multi-tap inductor are configured to have a first resonant frequency in a first frequency band, and wherein the second capacitor and the second portion of the multi-tap inductor are configured to have a second resonant frequency in a second frequency band.

3. The converter of claim 2, wherein the first capacitor is adjustable to tune the first resonant frequency according to a desired frequency of the output signal in the first frequency band.

4. The converter of claim 2, wherein the second capacitor is adjustable to tune the second resonant frequency according to a desired frequency of the output signal in the second frequency band.

5. The converter of claim 1, wherein the at least one switch comprises:
first, second, third, and fourth switches coupled respectively between the first, second, third, and fourth tap points and the respective output terminal of the converter.

6. The converter of claim 5, wherein at most one of the first, second, third, and fourth switches is turned on at any given time to couple at most one of the first, second, third, and fourth tap points to the respective output terminal of the converter.

7. The converter of claim 5, wherein at most one of the first, second, third, and fourth switches is turned on at any given time based on a desired frequency band and a desired signal standard of the output signal.

8. The converter of claim 7, wherein the desired signal standard is one of WCDMA, EDGE, GSM, HSPA, CDMA2000, WLAN, LTE, and WMAX.

9. The converter of claim 1, wherein the multi-tap inductor is a differential inductor having a center tap point coupled to AC ground.

10. The converter of claim 9, wherein each of the first portion and the second portion of the multi-tap inductor is centered at the center tap point.

11. The converter of claim 9, wherein each of the first portion and the second portion of the multi-tap inductor includes two inductances of equal value, symmetrically located around the center tap point.

12. The converter of claim 1, wherein the first, second, third, and fourth tap points are selectively coupled to first and second differential input signals.

13. The converter of claim 12, wherein the first and second differential input signals are AC differential current signals generated by a mixer circuit.

14. The converter of claim 12, wherein the single-ended output signal is a difference of the first and second differential input signals.

15. The converter of claim 1, wherein the converter is integrated on a transmitter chip.

16. The converter of claim 1, wherein the converter is integrated on a single semiconductor substrate.

17. A differential to single-ended converter, comprising:
a multi-tap inductor;
a first capacitor coupled to a first portion of the multi-tap inductor at first and second tap points of the multi-tap inductor;
a second capacitor coupled to a second portion of the multi-tap inductor at third and fourth tap points of the multi-tap inductor; and
at least one switch configured to selectively couple one of the first, second, third, and fourth tap points to a respective output terminal of the converter to generate a single-ended output signal of the converter,
wherein the converter is integrated in a multi-band transmitter, said multi-band transmitter having first and second mixer circuits configured respectively to operate in first and second frequency bands of the multi-band transmitter.

18. The converter of claim 17, wherein the multi-band transmitter is configured to operate in the first frequency band, and wherein the first mixer circuit is configured to generate first and second differential signals, said first and second differential signals coupled respectively to the first and second tap points of the multi-tap inductor.

19. The converter of claim 18, wherein the multi-band transmitter is configured to operate in the second frequency band, and wherein the second mixer circuit is configured to generate third and fourth differential signals, said third and fourth differential signals coupled respectively to the third and fourth tap points of the multi-tap inductor.

20. The converter of claim 18, wherein a resonant frequency of the first capacitor and the first portion of the multi-tap inductor is configured to match a frequency of the first and second differential signals.

21. The converter of claim 19, wherein a resonant frequency of the second capacitor and the second portion of the multi-tap inductor is configured to match a frequency of the third and fourth differential signals.

22. A multi-band transmitter, comprising:
first and second mixer circuits corresponding respectively to first and second frequency bands of the multi-band transmitter; and
a differential to single-ended converter, comprising:
a multi-tap inductor;
a first capacitor coupled to a first portion of the multi-tap inductor at first and second tap points of the multi-tap inductor; and
a second capacitor coupled to a second portion of the multi-tap inductor at third and fourth tap points of the multi-tap inductor;
wherein the first mixer circuit generates first and second differential signals, said first and second differential signals coupled respectively to the first and second tap points of the multi-tap inductor, when the multi-band transmitter is operated in the first frequency band; and
wherein the second mixer circuit generates third and fourth differential signals, said third and fourth differential signals coupled respectively to the third and fourth tap points of the multi-tap inductor, when the multi-band transmitter is operated in the second frequency band.

* * * * *